United States Patent
Choi

(10) Patent No.: US 6,864,566 B2
(45) Date of Patent: Mar. 8, 2005

(54) DUEL DIE PACKAGE

(75) Inventor: Ill Heung Choi, Cheonan (KR)

(73) Assignee: Samsung Electronics Co., Ltd., Suwon (KR)

( * ) Notice: Subject to any disclaimer, the term of this patent is extended or adjusted under 35 U.S.C. 154(b) by 204 days.

(21) Appl. No.: 10/157,585

(22) Filed: May 28, 2002

(65) Prior Publication Data

US 2003/0038348 A1 Feb. 27, 2003

(30) Foreign Application Priority Data

Aug. 21, 2001 (KR) .......................................... 2001-50302

(51) Int. Cl.[7] .................... H01L 23/495; H01L 23/02; H01L 23/48
(52) U.S. Cl. ...................... 257/676; 257/666; 257/686; 257/692; 257/696
(58) Field of Search ................................ 257/678, 685, 257/686, 688, 690, 692, 693, 694, 695, 696; 438/106, 109, 121

(56) References Cited

U.S. PATENT DOCUMENTS

| | | | | |
|---|---|---|---|---|
| 5,303,120 A | * | 4/1994 | Michii et al. ............... | 361/760 |
| 5,804,874 A | * | 9/1998 | An et al. ..................... | 257/676 |
| 6,252,299 B1 | * | 6/2001 | Masuda et al. ............. | 257/686 |
| 6,407,333 B1 | * | 6/2002 | Schroen ..................... | 174/52.4 |

FOREIGN PATENT DOCUMENTS

| | | |
|---|---|---|
| JP | 04-320365 | 11/1992 |
| JP | 05-067726 | 3/1993 |
| JP | 05-291486 | 11/1993 |
| JP | 08-316403 | 11/1996 |
| KR | 1019980034119 | 8/1998 |
| KR | 1019990085220 | 12/1999 |
| KR | 102000035276 | 6/2000 |
| KR | 1020000050487 | 8/2000 |

* cited by examiner

Primary Examiner—Hung Vu
(74) Attorney, Agent, or Firm—Harness, Dickey & Pierce, P.L.C.

(57) ABSTRACT

An improved dual die package is disclosed. The dual die package includes a first lead frame connected to a first semiconductor chip and a second lead frame connected to a second semiconductor chip. The first leads and the second leads are electrically connected to one another using a wirebonding process rather than a thermocompression process thereby allowing conventional packaging equipment to be used when manufacturing a dual die package.

4 Claims, 3 Drawing Sheets

DUEL DIE PACKAGE

BACKGROUND

1. Field of the Invention

The present invention relates to semiconductor packaging and, more particularly, to a dual die package (DDP).

2. Description of the Related Arts

Recent trends in electronics development have been toward smaller and thinner semiconductor packages. To satisfy the demand for smaller and thinner semiconductor packages, semiconductor packages that contain multiple semiconductor dies or chips ("multi-chip packages") have been developed. Multi-chip packages are used in a wide variety of applications, such as in laptop computers and cellular phones. When compared with single-chip packages, multi-chip packages have the advantages of miniaturization, low weight and high mounting density. For example, it is more advantageous to use a single thin small outline package (TSOP) including a flash memory chip and a SRAM chip than a semiconductor package including the flash memory chip and another semiconductor package including the SRAM chip.

Multi-chip packages can be classified as vertical-stacking type packages or parallel-aligning type packages. Vertical-stacking type packages reduce mounting area, while parallel-aligning type packages simplify the manufacturing process and reduce package thickness. To achieve miniaturization and low weight, vertical-stacking type packages are more commonly used.

FIG. 1 is a cross-sectional view of a conventional dual die package 200, which is a vertical-stacking type package. Dual die package 200 comprises a first chip 110 and a second chip 130. First chip 110 has electrode pads 112 on a center region of its active surface, and second chip 130 has electrode pads 132 on a center region of its active surface. Second leads 141 are mechanically connected to the active surface of second chip 130 via an adhesive 152, and first leads 121 are mechanically connected to the active surface of first chip 110 by an adhesive 152.

Second chip 130 is attached to the bottom surfaces of second leads 141 such that electrode pads 132 are located between the opposite second leads 141, and first chip 110 is attached to the bottom surfaces of first leads 121 such that electrode pads 112 are located between the opposite first leads 121. The back surfaces of first chip 110 and second chip 130 face one another and are disposed between first leads 121 and second leads 141.

First leads 121 comprise first contact portions 123 and first connection portions 125. First connection portions 125 are stepwise connected to first contact portions 123. Second leads 141 comprise second contact portions 143 and second connection portions 145. Second connection portions 145 are stepwise connected to second contact portions 143.

Electrode pads 112 of first chip 110 are electrically connected to first contact portions 123 via bonding wires 162, and electrode pads 132 of second chip 130 are electrically connected to second contact portions 143 via bonding wires 164. First chip 110, second chip 130 and the electrical connection parts are encapsulated with an encapsulant, thereby forming a package body 180.

First connection portions 125 of first leads 121 and second connection portions 145 of second leads 141 are mechanically attached to each other and electrically connected to each other. Outer lead portions (not shown) of first leads 121 are cut and removed. Outer lead portions 149 of second leads 141 are bent in a predetermined shape so that they can be mounted and serve as external connection terminals. After forming a metal layer 170 made of a metal such as solder or silver (Ag) on first connection portions 125 and second connection portions 145, the first connection portions 125 are attached to the corresponding second connection portions 145 using a thermocompression process carried out at a predetermined temperature and pressure. The thermocompression process mechanically and electrically connects first connection portions 125 and second connection portions 145.

One disadvantage with manufacturing conventional dual die package 200 is that the step of forming metal layer 170 on first leads 121 and second leads 141 and the step of attaching first leads 121 and second leads 141 using a thermocompression process to each other require additional manufacturing equipment, which increases the production cost of conventional dual die package 200. Another disadvantage with manufacturing conventional dual die package 200 is that the thermocompression process used to attach the first leads 121 of the first lead frame 120 to the second leads 141 of the second lead frame 140 requires highly reliable attaching technology, which increases the production cost of conventional dual die package 200.

Accordingly, what is needed is an improved dual die package.

SUMMARY

The present invention provides an improved dual die package. In one embodiment, a dual die package includes a first semiconductor chip having a back surface, a second semiconductor chip having a back surface that faces the back surface of the first semiconductor chip, a first lead frame having a plurality of first leads disposed over and electrically coupled to an active surface of the first semiconductor chip, a second lead frame having a plurality of second leads disposed over and electrically coupled to an active surface of the second semiconductor chip, and bonding wires that electrically connect the first leads to the second leads.

Other embodiments, aspects, and advantages of the present invention will become apparent from the following descriptions and the accompanying drawings.

BRIEF DESCRIPTION OF THE DRAWINGS

For a more complete understanding of the present invention and for further embodiments, aspects, and advantages, reference is now made to the following description taken in conjunction with the accompanying drawings in which.

DETAILED DESCRIPTION

Figure 1:
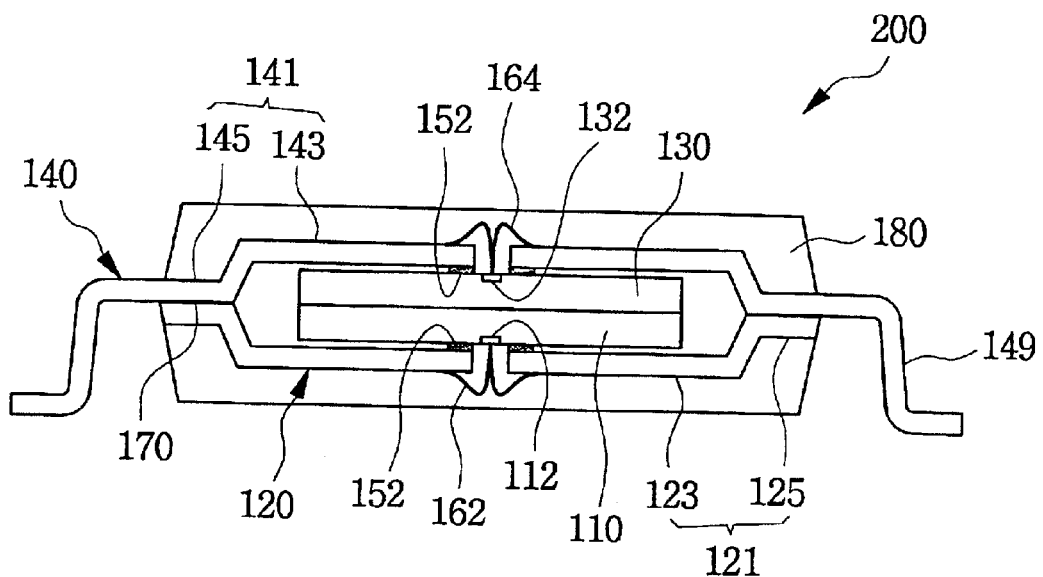
FIG. 1 is a cross-sectional view of a conventional dual die package.
Figure 3:
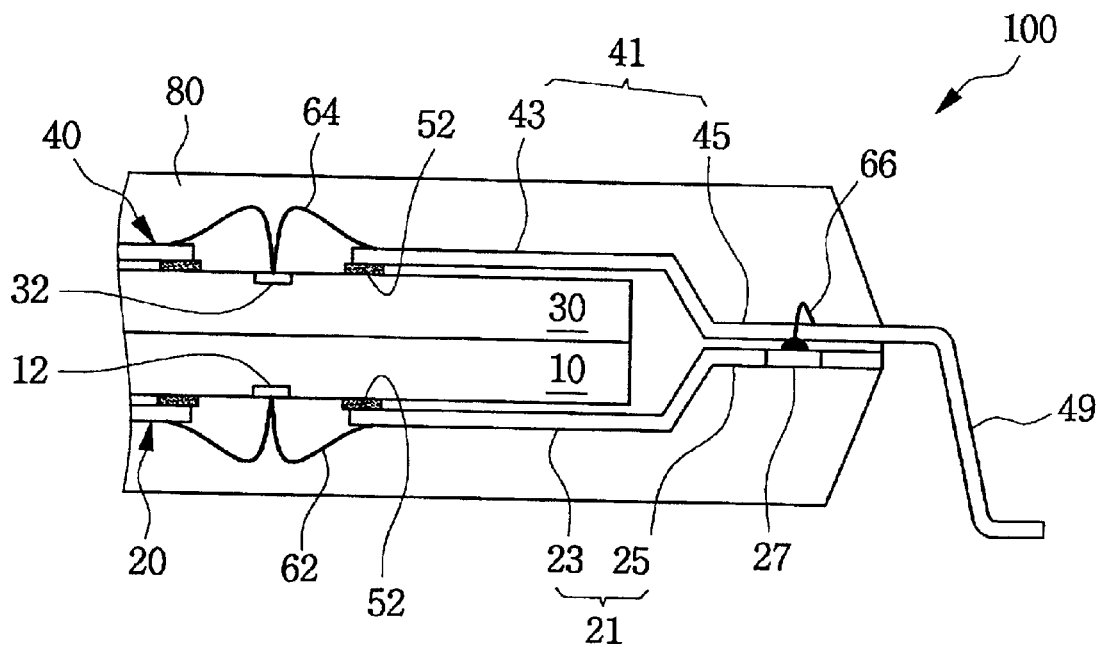
FIG. 3 is a cross-sectional view of the dual die package of FIG. 2 in accordance with an embodiment of the present invention.
Figure 2:
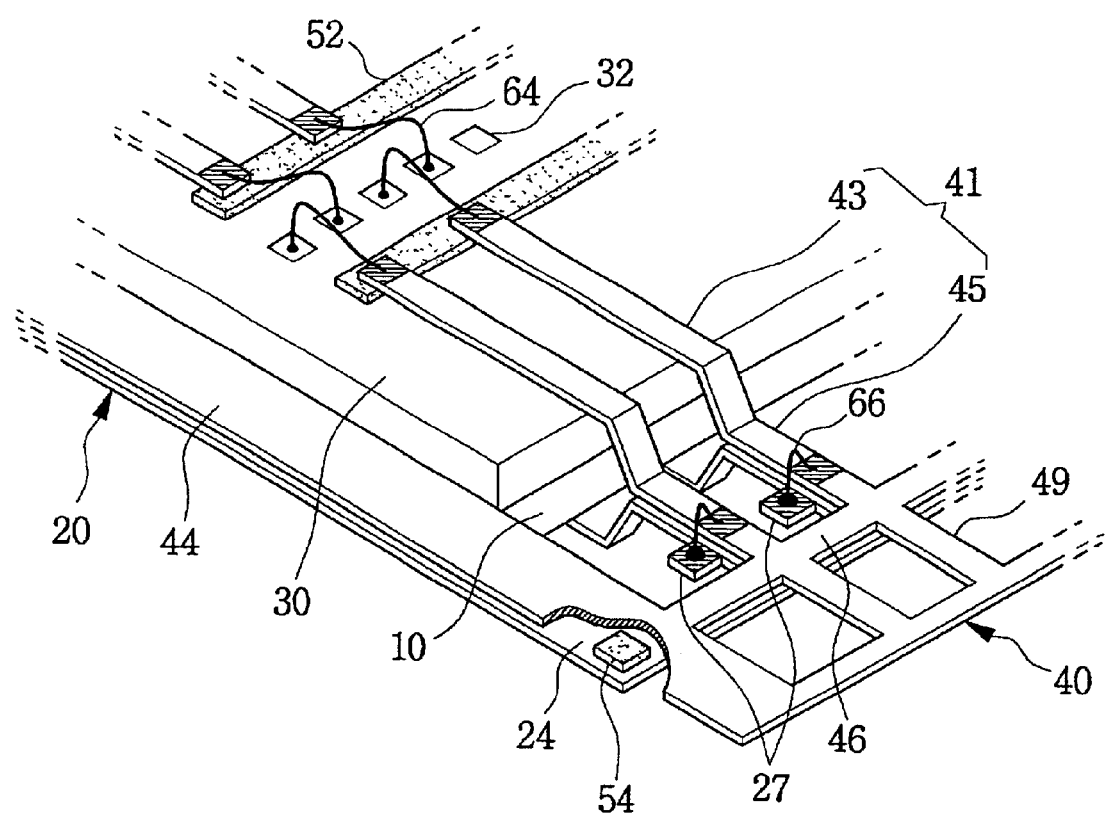
FIG. 2 is a perspective view showing wire bonding of a dual die package in accordance with an embodiment of the present invention.

FIG. 2 is a perspective view showing wire bonding of a dual die package 100 in accordance with an embodiment of the present invention. FIG. 3 is a cross-sectional view of dual die package 100.

As shown in FIGS. 2 and 3, dual die package 100 comprises a first chip 10 and a second chip 30. First chip 10 has a plurality of electrode pads 12 located at a center region of its active surface and second chip 30 has plurality of electrode pads 32 located at a center region of its active surface. The back surface of first chip 10 faces and is mounted to the back surface of second chip 30. First leads 21 of a first lead frame 20 are attached to the active surface of first chip 10, and second leads 41 of a second lead frame 40 are attached to the active surface of second chip 30. First leads 21 are electrically connected to electrode pads 12 of first chip 10 via bonding wires 62, and second leads 41 are electrically connected to electrode pads 32 of the second chip 30 via bonding wires 64. First chip 10, second chip 30 and the electrical connection parts are encapsulated with a liquid molding resin, thereby forming a package body 80.

As described in more detail below, the active surface of second chip 30 is attached to the bottom surface of inner terminals of second leads 41 by an adhesive tape 52, and the active surface of first chip 10 is attached to the bottom surface of inner terminals of first leads 21 by an adhesive tape 52. Electrode pads 32 of second chip 30 are located between opposite second leads 41, and electrode pads 12 of first chip 10 are located between opposite first leads 21. The back surfaces of first chip 10 and second chip 30 face one another and are located between first leads 21 and second leads 41. First leads 21 comprise first contact portions 23 and first connection portions 25, and second leads 41 comprise second contact portions 43 and second connection portions 45.

Electrode pads 12 of first chip 10 are electrically connected to first contact portions 23 of first leads 21 by first bonding wires 62, and electrode pads 32 of second chip 30 are electrically connected to second contact portions 43 of second leads 41 by second bonding wires 64. The surfaces of first contact portions 23 and second contact portions 43 can be plated with silver (Ag), thereby obtaining excellent bondability between first and second bonding wires 62 and 64 and first and second contact portions 23 and 43, respectively.

Figure 4:
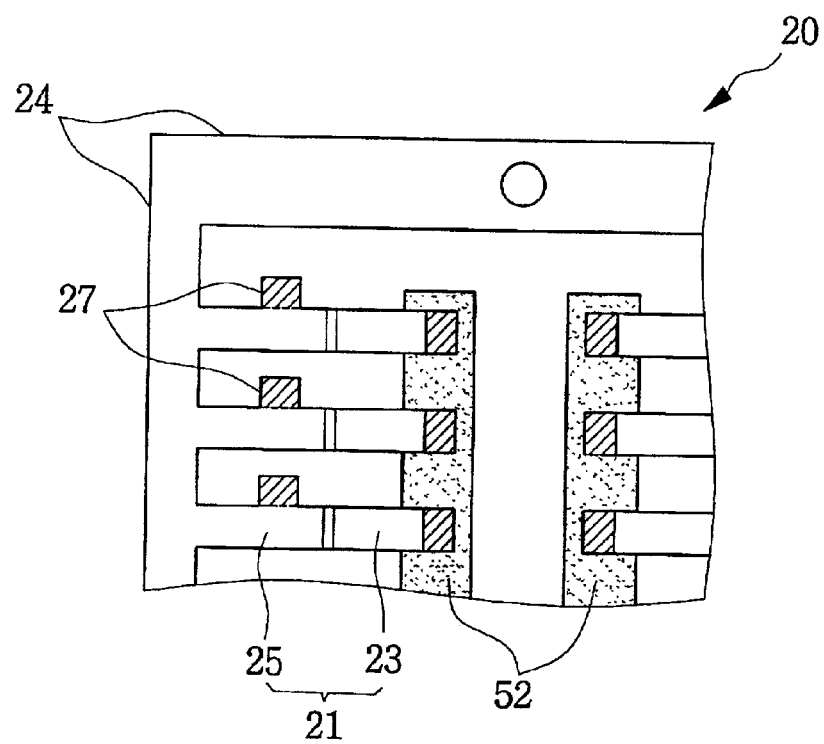
FIG. 4 is a bottom plan view of the dual die package of FIG. 2.

FIG. 4 is a bottom plan view of the dual die package 100 of FIG. 2. First lead frame 20 for a lead-on-chip (LOC) package includes connection pads 27. Each connection pad 27 protrudes from the side surface of a corresponding first connection portion 25. An outer terminal of the first connection portion 27 is connected to a side rail 24. An adhesive layer 54 (shown in FIG. 2) is discontinuously formed along side rail 24 of the lead frame 20. In the embodiment shown, side rail 24 also servers as a dambar.

Figure 5:
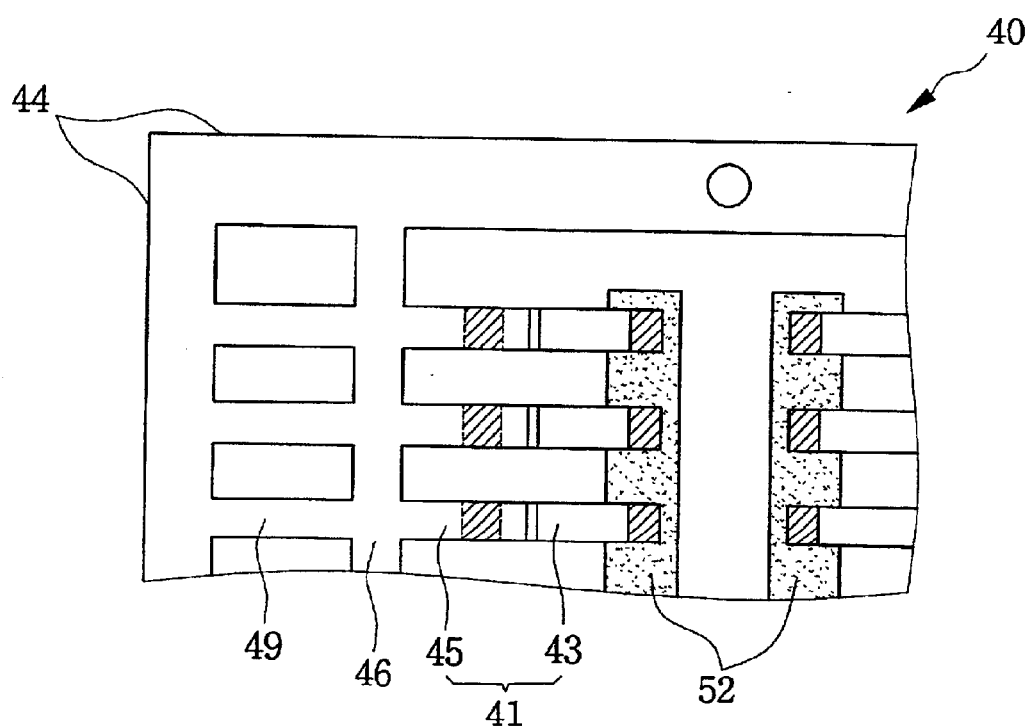
FIG. 5 is a top plan view of the dual die package of FIG. 2.

FIG. 5 is a top plan view of the dual die package 100 of FIG. 2. The structure of second lead frame 40 for an LOC package is identical to first lead frame 20, except that outer leads 49 are formed outside of second connection portions 45. That is, outer leads 49 extend away from the second connection portions 45. A dambar 46 is formed between outer leads 49. Both ends of dambar 46 are connected to a side rail 44 of second lead frame 40.

First lead frame 20 having first chip 10 attached thereto is stacked on second lead frame 40 having second chip 30 attached thereto so that the back surface of first chip 10 is facing the back surface of second chip 30. Adhesive layer 54 is interposed between side rail 24 of first lead frame 20 and side rail 44 of second lead frame 40 and mechanically connects first lead frame 20 to second lead frame 40.

Adhesive layer 54 can be formed on side rail 24 of first lead frame 20 and/or side rail 44 of second lead frame 40. In the embodiment shown, adhesive layer 54 is formed on side rail 24 of first lead frame 20. A liquid adhesive or a double-sided adhesive tape can be used for adhesive layer 54.

After the encapsulating step, side rails 24 and 44 are cut and removed by a trimming/forming step. At this time, first connection portions 25 may or may not be in contact with respective second connection portions 45.

Connection pads 27 are formed on first connection portions 25. This allows first connection portions 25 to be electrically connected to second connection portions 45 via third bonding wires 66. Connection pads 27 have a predetermined shape and protrude from the side surface of corresponding first connection portions 25. Second connection portions 45 are electrically connected to corresponding connection pads 27 of corresponding first connection portion 25 via third bonding wires 66. In this embodiment, third bonding wires 66 are connected to corresponding connection pads 27 via the ball bonding method and are connected to corresponding second connection portions 45 via the stitch bonding method. In some embodiments, connection pads 27 and second connection portions 45 are plated with silver (Ag), thereby providing excellent bondability with third bonding wires 66. Although bonding wires 66 are connected to connection pads 27 via the ball bonding method and connected to second connection portion 45 via the stitch bonding method in the embodiment shown, those of ordinary skill in the art will recognize that these connection methods may be achieved in the reverse direction, or that the bonding wires may be connected to the second connection portion by the wedge bonding method.

First lead frame 20 and second lead frame 40 are attached to one another by adhesive layer 54, and first leads 21 and second leads 41 are electrically connected to one another via third bonding wires 66. As a result, dual die package 100 of the present invention does not require a thermocompression process to be used to mechanically and electrically connect first leads 21 to second leads 41 and thus dual die package 100 of the present invention can be manufactured by using the conventional manufacturing equipment (e.g., conventional wire bonding equipment).

As shown in FIG. 3, first chip 10, second chip 30 and electrical connection parts including first, second and third bonding wires 62, 64 and 66 are encapsulated, thereby forming package body 80. Outer leads 49 of second leads 41 extrude from package body 80 and are bent in a predetermined manner so that they can be mounted and serve as external connection terminals. In some embodiments, outer leads 49 are bent to form a gull wing shape.

One advantage of the present invention is that first lead frame 20 is fixed to second lead frame 30 by adhesive layer 54, which is advantageous because it provides stability during subsequent manufacturing steps.

Another advantage of the present invention is that a thermocompression process is not required to attach first leads 21 and second leads 41. Rather, first leads 21 and second leads 41 are electrically connected via third bonding wires 66 using conventional wire bonding equipment and are mechanically connected by adhesive layer 54. Therefore, the present invention does not require non-conventional manufacturing equipment and thus reduces production costs for dual die packages.

Moreover, compared to the conventional thermocompression process that connects the first leads of the first lead frame to the second leads of the second lead frame, it is easier to connect the first leads to the second leads using the wire bonding process and the resulting electrical connection between the first leads and the second leads is a more reliable.

While particular embodiments of the present invention have been shown and described, it will be apparent to those skilled in the art that changes and modifications may be made without departing from this invention in its broader aspect and, therefore, the appended claims are to encompass within their scope all such changes and modifications as fall within the true spirit of this invention.

What is claimed is:

1. A dual die package comprising:
   a first semiconductor chip having a plurality of first electrode pads located at a center portion of its active surface;
   a first lead frame having a plurality of first leads, the first leads comprising:
   first contact portions disposed above the active surface of said first chip;
   first connection portions stepwise connected to the first contact portions; and
   connection pads, each protruding from a side surface of a corresponding first connection portion;
   first bonding wires that electrically connect the first electrode pads to the first contact portions;
   a second semiconductor chip having a plurality of second electrode pads located at a center portion of its active surface, wherein a back surface of the second semiconductor chip is attached to a back surface of the first semiconductor chip;
   a second lead frame having a plurality of second leads, the second leads comprising:
   second contact portions disposed above the active surface of said second chip; and
   second connection portions stepwise connected to the second contact portions;
   second bonding wires that electrically connect the second electrode pads to the second contact portions;
   third bonding wires that electrically connect the connection pads of the first leads to the second connection portions of the second leads; and
   a package body that encapsulates the first chip, the second chip, the first bonding wires, the second bonding wires, the third bonding wires, the first connection portions of the first leads and the second connection portions of the second leads.

2. The dual die package of claim 1 wherein the second lead frame further comprises outer leads, which are integrated with the second connection portions and protrude from the package body.

3. The dual die package of claim 1 wherein the connection pads and the second connection portions are plated with silver.

4. The dual die package of claim 1 wherein the connection pads of the first connection portions are electrically connected to the second connection portions of the corresponding second leads.

* * * * *